United States Patent
Jeong

(10) Patent No.: US 7,830,705 B2
(45) Date of Patent: Nov. 9, 2010

(54) MULTI-LEVEL PHASE CHANGE MEMORY DEVICE AND RELATED METHODS

(75) Inventor: Gi-Tae Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 178 days.

(21) Appl. No.: 12/216,534

(22) Filed: Jul. 7, 2008

(65) Prior Publication Data

US 2009/0016100 A1     Jan. 15, 2009

(30) Foreign Application Priority Data

Jul. 12, 2007    (KR)   ..................... 10-2007-0070157

(51) Int. Cl.
*G11C 11/00*     (2006.01)
(52) U.S. Cl. ..................... 365/163; 365/148; 365/210.1
(58) Field of Classification Search ................ 365/100, 365/148, 158, 163, 171, 189.07, 189.09, 365/210.1
See application file for complete search history.

(56) References Cited

U.S. PATENT DOCUMENTS

| | | | |
|---|---|---|---|
| 6,314,014 B1* | 11/2001 | Lowrey et al. | 365/100 |
| 6,608,773 B2* | 8/2003 | Lowrey et al. | 365/100 |
| 7,463,699 B2* | 12/2008 | Zhang et al. | 375/316 |
| 2007/0159870 A1* | 7/2007 | Tanizaki et al. | 365/148 |

FOREIGN PATENT DOCUMENTS

| | | |
|---|---|---|
| JP | 2004-110867 | 4/2004 |
| KR | 1020050116569 | 12/2005 |
| KR | 1020060086132 | 7/2006 |

\* cited by examiner

*Primary Examiner*—Gene N. Auduong
(74) *Attorney, Agent, or Firm*—Harness, Dickey & Pierce, P.L.C.

(57) ABSTRACT

Provided are a phase change memory device and a reading method thereof. An example embodiment of a phase change memory device may include main cells programmed to have any one of a plurality of resistance states respectively corresponding to multi-bit data, reference cells programmed to have at least two respectively different resistance states among the resistance states each time the main cells are programmed, and a reference voltage generation circuit sensing the reference cells to generate reference voltages for identifying each of the resistance states.

27 Claims, 11 Drawing Sheets

MULTI-LEVEL PHASE CHANGE MEMORY DEVICE AND RELATED METHODS

PRIORITY STATEMENT

This U.S. non-provisional patent application claims priority under 35 U.S.C. §119 of Korean Patent Application No. 10-2007-0070157, filed on Jul. 12, 2007, the entire contents of which are hereby incorporated by reference.

BACKGROUND

1. Field

Example embodiments disclosed herein relate to a semiconductor memory device, and more particularly, to a phase change memory device and related methods.

2. Description of Related Art

Demands for semiconductor memory devices have increased because of their advantages. For example, some of the advantages of semiconductor memory devices are random accessibility and higher integration and capacity storage than other memory devices. A flash memory device as a semiconductor memory device is commonly used in various portable electronic devices. Besides that, a semiconductor memory device substituting a capacitor of a dynamic random access memory (DRAM) for a non-volatile material has been used conventionally. Examples are a ferroelectric RAM (FRAM) using a ferroelectric capacitor, a magnetic RAM (MRAM) using a tunneling magneto-resistive layer (TMR), and a phase change memory device using chalcogenide alloys. A multi-level phase change memory device is a non-volatile memory device whose manufacturing processes are relatively simple such that low-cost high capacity memory can be achieved.

A phase change memory cell generally utilizes diverse materials that can electrically change between various structured states. The various structured states respectively represent different electrical read-out characteristics. For example, there are memory devices formed of a chalcogenide material (hereinafter, referred to as a GST material), i.e., a germanium (Ge)-stibium(Sb)-tellurium(Te) compound. The GST material may be programmed into a state between an amorphous state generally having a relatively high resistivity and a crystalline state generally having a relatively low resistivity. The phase change memory cell may be programmed through the heating of the GST material. The time duration and temperature of the heating may determine whether the GST material remains in an amorphous state or a crystalline state. High resistivity and low resistivity may represent programmed values 0 and 1, respectively, which may be sensed by measuring a resistance of the GST material.

In a typical phase change memory device, a memory cell includes a resistance device and a switching device. FIGS. 1A and 1B are circuit diagrams representing a memory cell of a phase change memory device. Referring to FIG. 1A, a memory cell 10 of the phase change memory device includes a resistance device (i.e., a variable resistor 11 and a switching device (i.e., an access transistor 12).

As shown in FIG. 1A, a variable resistor 11 is connected to a bit line BL, and the access transistor 12 is connected between the variable resistor 11 and a ground. A word line WL is connected to a gate of the access transistor 12. Once a desired and/or predetermined voltage is applied to the word line WL, the access transistor 12 is turned on. Once the access transistor 12 is turned on, the variable resistor 11 receives current through the bit line BL.

FIG. 1B is a circuit diagram of a memory cell 20. The memory cell 20 includes a variable resistor 21 as the resistance device and a diode 22 as the switching device. The diode 22 is turned on or off depending on a word line voltage.

The variable resistors 11 and 21 may include a phase change material (not shown). The phase change material may have one of two stable states (e.g., a crystal state and an amorphous state). The phase change material changes into a crystal state or an amorphous state according to current supplied through a bit line BL. Programming data of a phase change memory device takes advantage of the above characteristic of the phase change material. The switching device can be realized with various devices such as a MOS transistor and a diode.

FIG. 2 is a graph illustrating characteristics of a phase change material, which may be used as a variable resistor. The curve (1) of FIG. 2 indicates a temperature condition that allows a phase change material to change into an amorphous state. The curve (2) of FIG. 2 indicates a temperature condition that allows a phase change material to change into a crystal state. Referring to the curve (1), the phase change material becomes an amorphous state after heating the phase change material at a temperature higher than a melting temperature Tm through supply of a current pulse until time T1 and then rapidly quenching the temperature of the phase change material. The amorphous state may be referred to as a reset state and may correspond to data 1. Referring to the curve (2), the phase change material becomes a crystal state after heating the phase change material for a longer time T2 than the time T1 at a temperature higher than a crystallization temperature Tc but lower than the melting temperature Tm and then quenching the temperature of the phase change material as a rate slower than used to quench the temperature of the phase change material to set the material in the amorphous state. The crystal state may be referred to as a set state and may correspond to data 0. The resistance of a memory cell varies depending on an amorphous volume. Typically, the memory cell's resistance is the highest when the phase change material is in an amorphous state and is the lowest when the phase change material is in a crystal state.

Recently, a technique storing more than 2-bit data in one memory cell is under development. This type of memory cell is generally referred to as a multi-level cell (MLC). In a phase change memory device, the MLC has intermediate states between a reset state and a set state.

SUMMARY

Example embodiments provide a multi-level phase change memory device having a high resolution reading performance and a reading method thereof.

Example embodiments provide variable resistance memory devices. A memory device may include a plurality of main cells programmed to have any one of a plurality of resistance states respectively corresponding to multi-bit data; a plurality of reference cells programmed to have at least two respectively different resistance states among the resistance states each time the main cells are programmed; and a reference voltage generation circuit sensing the reference cells to generate reference voltages for identifying each of the resistance states.

According to an example embodiment, the main cells and the reference cells are connected to the same word line.

According to an example embodiment, the reference cells are programmed to have resistance values corresponding to two respectively different states among the resistance states.

According to an example embodiment, each time the main cells are programmed into any one of first to fourth states having respectively different resistance magnitudes, the reference cells are programmed. The reference cells may include a first reference cell and a second reference cell. For example, the first reference cell is programmed into the second state, and the second reference cell is programmed into a third state higher than the second state.

According to an example embodiment, the reference voltage generation circuit is connected to the first reference cell via a first reference bit line and to the second reference cell via a second bit line. The reference voltage generation circuit may generate a first reference voltage by sensing the first reference bit line of the first reference cell to identify the first and second states, a third reference voltage by sensing the second reference bit line of the second reference cell to identify the third and fourth states, and a second reference voltage to identify the second and third states by using levels of the first and third reference voltages.

According to an example embodiment, the second reference voltage is an arithmetic mean of the first and third reference voltages.

According to an example embodiment, the reference cells are programmed to have resistance values respectively corresponding to the resistance states.

According to an example embodiment, the number of the reference cells corresponds to the number of resistance states.

According to an example embodiment, each time the main cells are programmed to have any one of first to fourth states having respectively different resistance magnitudes, the reference cells are programmed. For example, the reference cells may include a first reference cell programmed into the first state, a second reference cell programmed into the second state having a higher resistance value than the first state, a third reference cell programmed into the third state having a higher resistance value than the second state, and a fourth reference cell programmed into the fourth state having a higher resistance value than the third state.

According to an example embodiment, the reference voltage generation circuit senses bit lines of the first to fourth reference cells to generate first to third reference voltages for identifying the first to fourth states.

According to an example embodiment, each of the main cells and the reference cells includes a variable resistor having any one of the resistance states, and a selection device switching to be selected in response to a select signal provided into the word line.

According to an example embodiment, the variable resistor includes chalcogenide alloys.

According to an example embodiment, the variable resistor includes a crystal state and a plurality of amorphous states respectively corresponding to the resistance states.

According to an example embodiment, a variable resistance memory device may include a sense amplifier circuit that compares each bit line voltage of the main cells with the reference voltage to read multi-bit data stored in the main cells.

According to an example embodiment, a variable resistance memory device may include a write driver programming the reference cells to have at least two respectively different states among the resistance states each time the main cells are programmed.

An example embodiment provides a reading method of a variable resistance memory device including memory cells and reference cells. The reading method may include generating at least one reference voltage by using bit line voltages sensed from reference cells, and reading data programmed in main cells by referring to a reference voltage.

According to an example embodiment, the reading method further includes programming the reference cells to have at least two states among the resistance states.

According to an example embodiment, the reference cells are programmed each time at least one of the main cells is programmed.

According to an example embodiment, the generating of the reference voltage includes generating a plurality of reference voltages to identify each of the resistance states by using bit line voltages. The bit line voltages may correspond to two respectively different states sensed from the reference cells.

According to an example embodiment, the reference cells may include two reference cells. The two reference cells may be programmed to have resistance values corresponding to the two respectively different states.

According to an example embodiment, the generating of the reference voltage includes generating a plurality of reference voltages to identify each of the resistance states using each bit line voltage of the respective reference cells.

According to an example embodiment, the main cells and the reference cells include phase change memory cells.

Still another example embodiment provides a reference voltage generating method of a multi-level phase change memory device having one of a plurality of resistance states. The method may include programming a plurality of reference cells to have resistance values corresponding to at least two states among the resistance states; and generating a reference voltage by using bit line voltages sensed from the reference cells.

According to an example embodiment, the programming of the reference cells is performed each time at least one of main cells is programmed. The main cells may be connected to the same word line to which the reference cells are connected.

According to an example embodiment, the reference cells are programmed with resistance values corresponding to two respectively different states among the resistance states.

According to an example embodiment, the generating of the reference voltage includes generating a reference voltage to identify each of the resistance states by using a bit line voltage corresponding to the two respectively different states.

According to an example embodiment, the reference cells include two phase change memory cells. The two phase change memory cells being programmed to have resistance values corresponding to two respectively different states.

According to an example embodiment, the generating of the reference voltage includes generating a plurality of reference voltages to identify the resistance states by using bit line voltages of the two reference cells.

Still another example embodiment provides a memory system. The memory system may include a variable resistance memory device, and a memory controller controlling the variable resistance memory device. The variable resistance memory device may include a plurality of main cells programmed to have any one of a plurality of resistance states respectively corresponding to multi-bit data, a plurality of reference cells programmed to have at least two respectively different resistance states among the resistance states each time the main cells are programmed, and a reference voltage generation circuit sensing the reference cells to generate reference voltages for identifying each of the resistance states.

BRIEF DESCRIPTION OF THE FIGURES

The accompanying figures are included to provide a further understanding of example embodiments, and are incorporated in and constitute a part of this disclosure. The drawings illustrate example embodiments and, together with the detailed description, serve to explain advantages, principles and scope of this disclosure. In the figures.

DETAILED DESCRIPTION OF EXAMPLE EMBODIMENTS

Figure 1A:
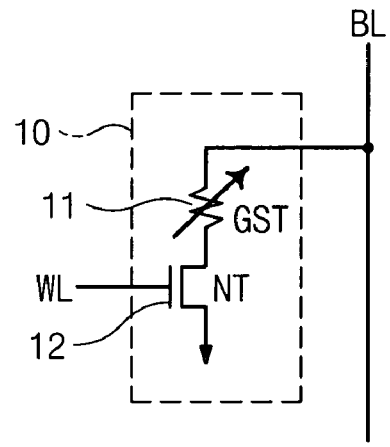
FIGS. 1A and 1B are circuit diagrams of a memory cell of a phase change memory device, respectively, in which example embodiments may be applied.
Figure 1B:
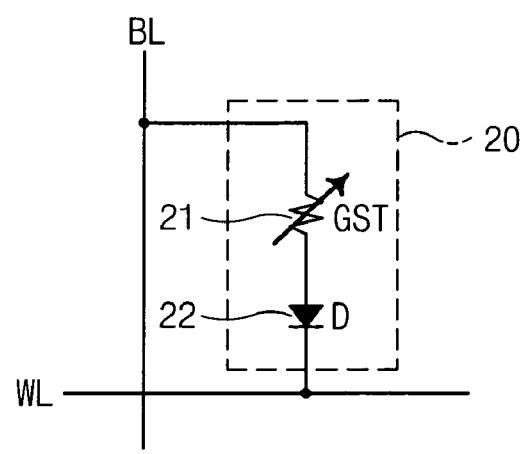
Figure 2:
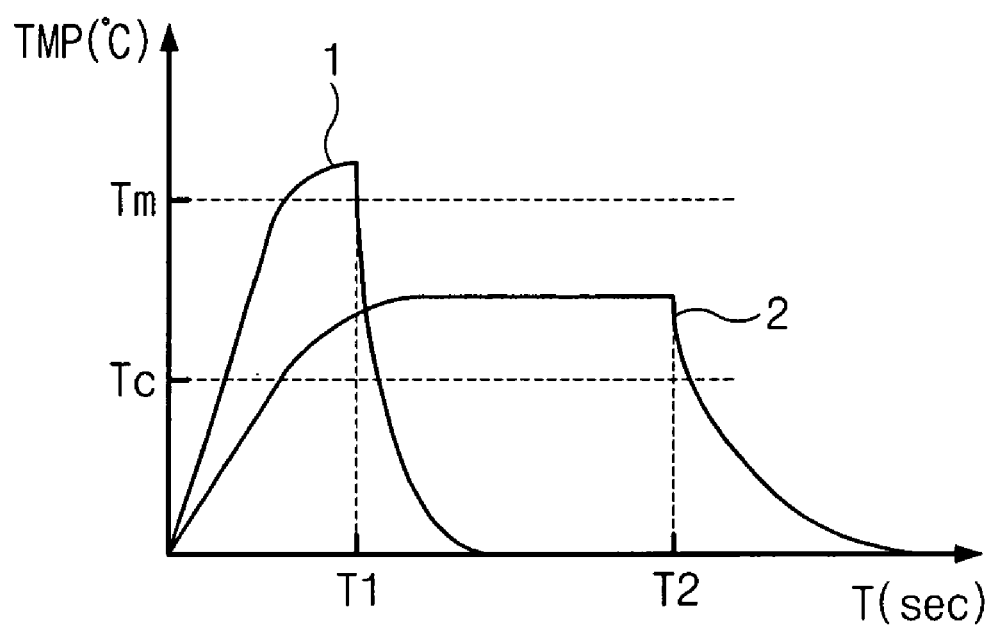
FIG. 2 is a graph illustrating a temperature characteristic of a phase change memory during a program operation.

Various example embodiments will now be described more fully with reference to the accompanying figures. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. are used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms a "an" and "the" are intended to include the plural forms as well, unless the context clearly indicates otherwise. It will be further understood that the terms "com- prises", "comprising", "includes" and/or "including", when used herein, specify the presence of stated features, integers, steps, operations, elements, and/or components, but do not preclude the presence or addition of one or more other features, integers, steps, operations, elements, components, and/ or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the figures are provided so that this disclosure will be thorough, complete and fully convey the concept of example embodiments to those skilled in the art. In the drawings, like numbers refer to like elements throughout.

Figure 3:
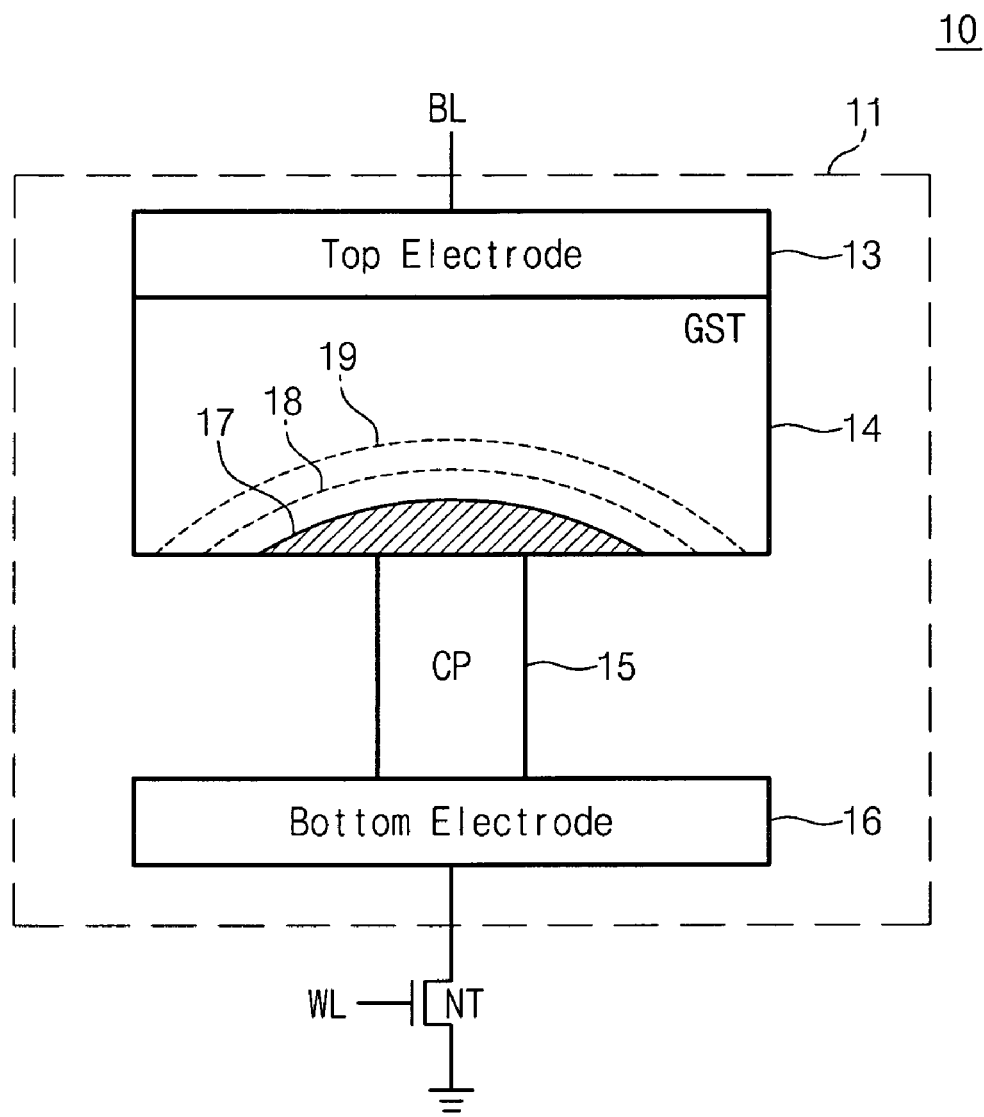
FIG. 3 is a sectional view illustrating multi-level states of a phase change memory device according to an amorphous volume.

FIG. 3 is a sectional view illustrating a memory cell of a multi-level phase change memory device according to an example embodiment. Referring to FIG. 3, the memory cell 10 includes a variable resistor 11 and an access transistor NT. The variable resistor 11 is connected to a bit line BL. The access transistor NT is connected to the variable resistor 11 and a ground. A word line WL is connected to a gate of the access transistor NT. When the access transistor NT is turned on, the variable resistor 11 receives current Ic through the bit line BL. It is apparent to those skilled in the art that the switching device, e.g., the access transistor NT shown in FIG. 3, could also be a diode.

Referring to FIG. 3, the variable resistor 11 includes a top electrode 13, a phase change material (e.g., a germanium-stibium-tellurium (GST) material) 14, a contact plug (shown as CP) 15, and a bottom electrode 16. The top electrode 13 is connected to the bit line BL. The bottom electrode 16 is connected between the contact plug 15 and the access transistor NT. The contact plug 15 is formed of a conductive material (e.g., TiN) and may be referred to as a heater plug. The phase change material 14 is disposed between the top electrode 13 and the contact plug 15. A phase of the phase change material 14 may vary depending on the amplitude, duration, and fall time of a current pulse, for example. As the phase change material 14 progresses from an amorphous state into a crystal state, an amorphous volume of the phase change material 14 decreases.

The phase change material 14 may have more than two states depending on characteristics of a current pulse provided through the bit line BL. The memory cell 10 has one of multi-states according to an amorphous volume in the phase change material 14. According to the amorphous volume of the phase change material 14, a resistance of the variable resistor 11 varies. For example, amorphous volumes 17, 18, and 19 of the phase change material 14 shown in FIG. 3 are formed using respectively different current pulses corresponding to respectively different multi-bit data. The variable resistor 14 may be programmed into one of a set state corresponding to a crystal state and the above-mentioned reset states 17, 18, and 19 based on a received current pulse.

Figure 4A:
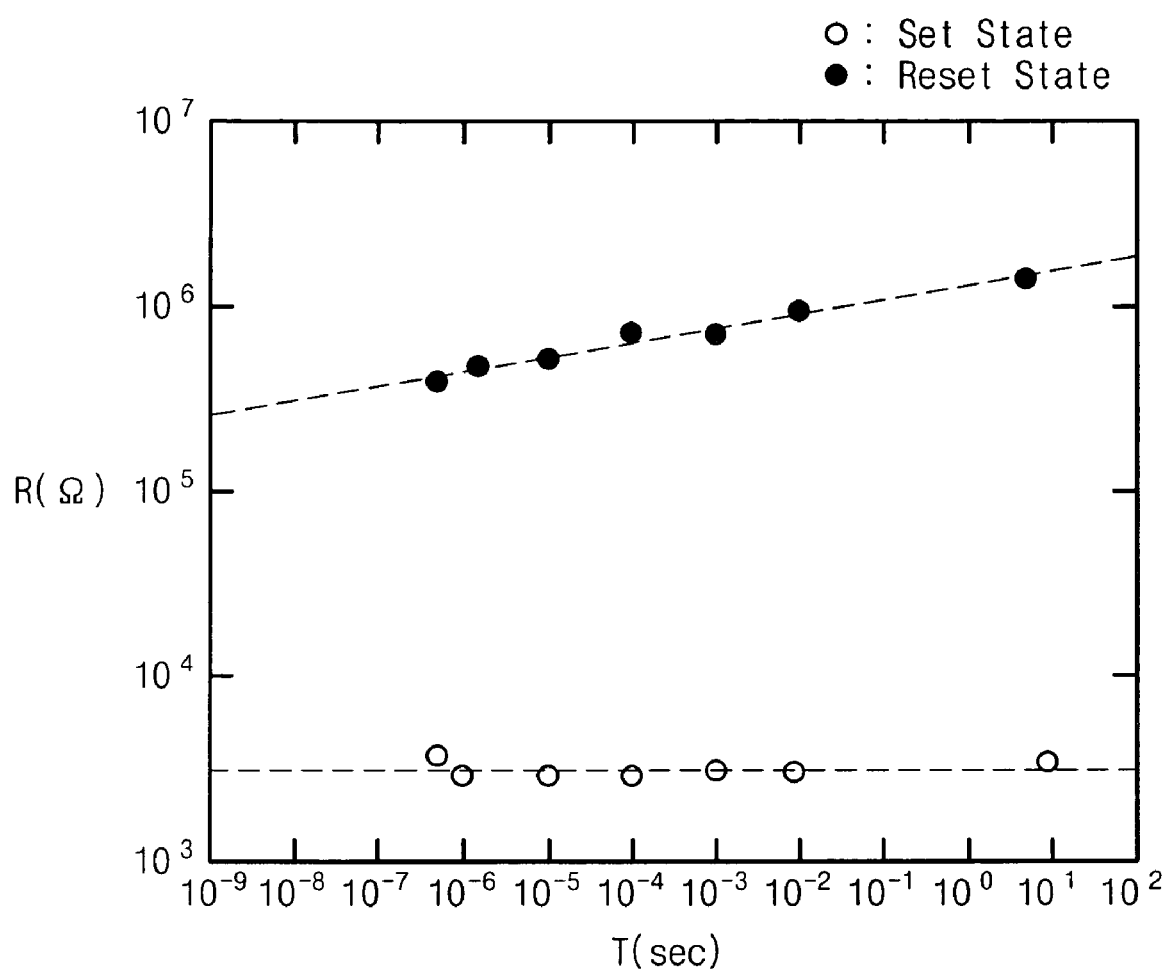
FIG. 4A is a graph illustrating a resistance characteristic according to a time of a phase change memory cell.

FIG. 4A is a graph illustrating a resistance variation as time elapses in a memory cell having an amorphous state. For example, the resistance of a resistance device may increase as time elapses due to various factors. Further, the greater the initial resistance of a resistance device, the more drastically a resistance value of a reset state may increase over time. Referring to FIG. 4A, the x-axis of the graph represents the time elapsed after a memory cell is programmed. The y-axis of the graph represents a resistance value of a memory cell. As illustrated in FIG. 4A, the resistance value of the resistance device increases as time elapses without maintaining a fixed value after being programmed. In a multi-level cell, this characteristic of the resistance device may reduce a read margin. Accordingly, if data are read after being programmed and a predetermined time elapses, an error may be sensed in the data. Resistance variation due to the time elapsed is an example of a factor, which may inhibiting realization of an efficient and/or effective multi-level phase change memory device.

Figure 4B:
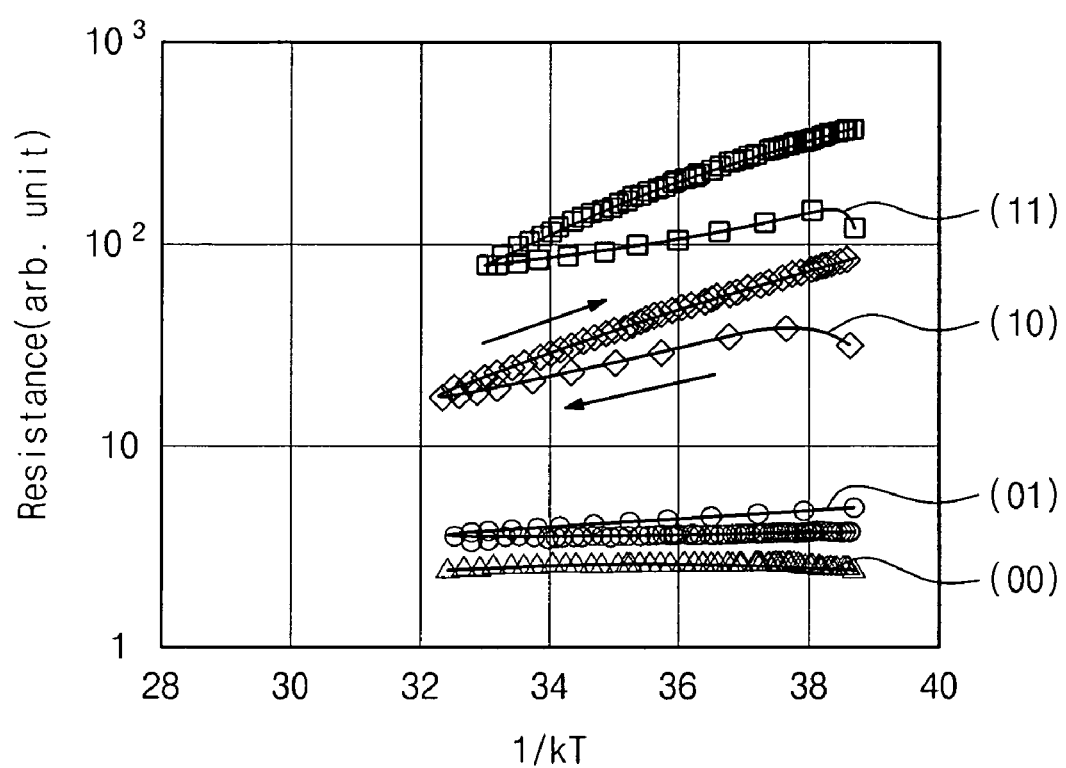
FIG. 4B is a graph illustrating a resistance characteristic according to a temperature hysteresis of a phase change memory cell.

FIG. 4B is a graph illustrating a temperature hysteresis of a resistance device in a phase change memory cell. The temperature hysteresis curve of FIG. 4B relates to a 2-bit multi-level cell. Affects on a resistance variation related to a temperature hysteresis are described with reference to memory cells in which data are programmed into a state 11, a state 10, a state 01 and a state 00, for example. FIG. 4B illustrates that a resistance of a resistance device varies according to a function of temperature (1/kT where k and T represents the Boltzmann constant and the absolute temperature, respectively). The temperature hysteresis represents a resistance value variation of a resistance device when the resistance device is restored to the original temperature after raising a temperature over a time duration. That is, respective resistance values corresponding to 2-bit data (11, 10, 01, and 00) have different resistance change rates as a temperature is increased and decreased. If considering the temperature hysteresis of a memory cell where data 10 is programmed, the resistance variation curve of when a temperature is increased is not identical to the resistance variation curve of when a temperature is decreased. Even if the temperature is restored to an initial temperature, the resistance of the resistance device may have a value different from a value of before the temperature changes due to the influence of temperature variation. Because of this characteristic, in an extreme case, a resistance value corresponding to a state 11 overlaps a resistance value corresponding to a state 10 such that reliability of a sensing operation is reduced. This phenomenon may be an issue in storing more than 2-bit data within a limited resistance window in a multi-level cell.

An example embodiment provides a sensing scheme taking into account that a variable value may change according to the time and/or temperature of the resistance device as shown in FIGS. 4A and 4B. However, one skilled in the art will appreciate that a variable resistance of a resistance device may result from various factors besides time and temperature. Example embodiments provide a method and a device of providing a variable reference voltage that can be used for cancelling a resistance variation caused by the various factors.

Figure 5:
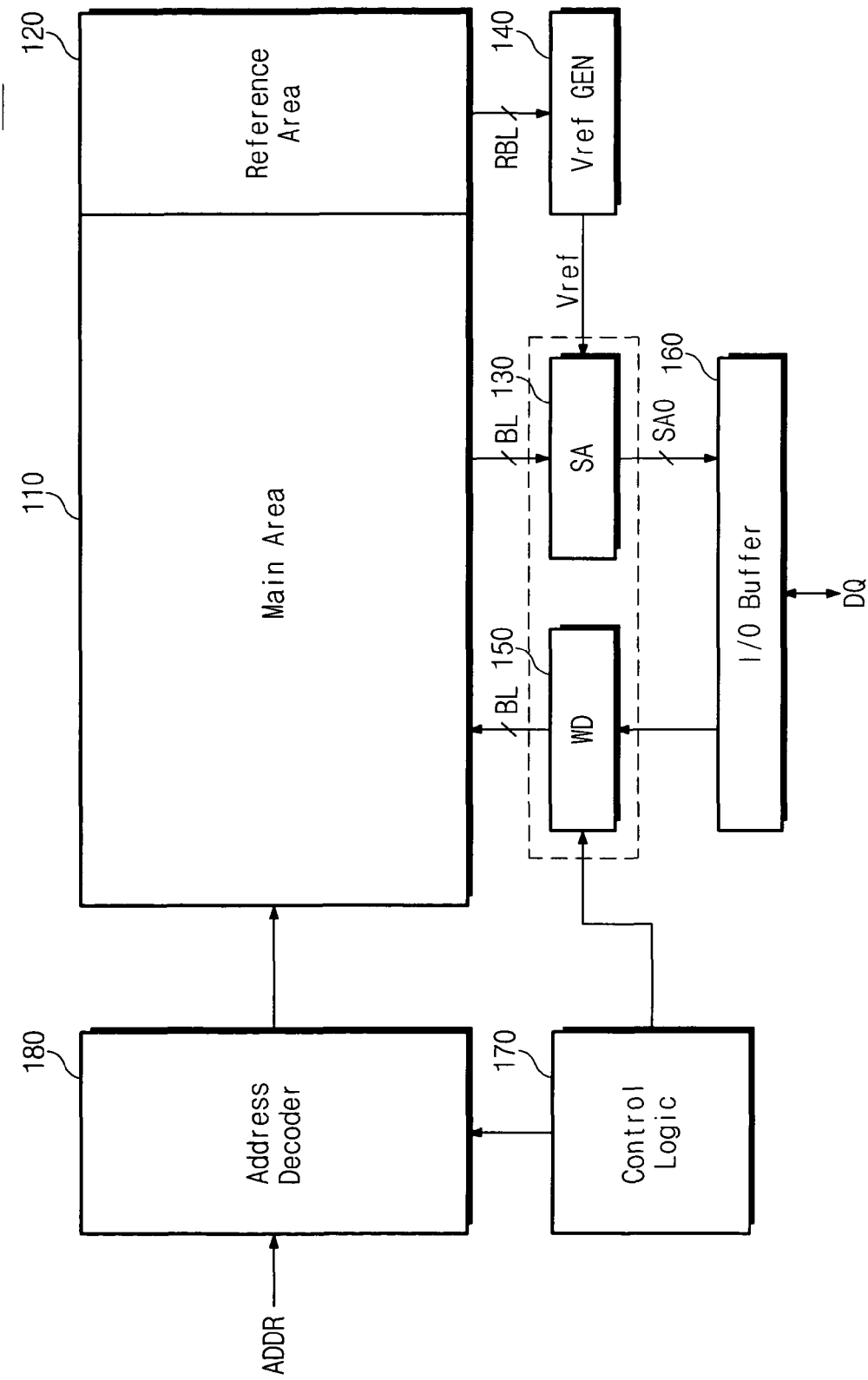
FIG. 5 is a block diagram of a phase change memory device according to an example embodiment.

FIG. 5 is a block diagram of a multi-level phase change memory device 100 according to an example embodiment. Referring to FIG. 5, during a read operation, a plurality of bit line voltages are provided from memory cells of a reference area 120 into a reference voltage generation circuit (shown as Vref GEN) 140. The reference voltage generation circuit 140 generates a reference voltage Vref with reference to bit line voltages. The reference voltage Vref is a reference value that can be used for compensating for resistance value variations of the memory cells in the main area 110, and is provided into a sense amplifier circuit (shown as SA) 130.

The main area 110 may include a plurality of phase change memory cells storing multi-bit data. An example embodiment of a multi-level phase change memory device 100 also includes a reference area 120, which may have a plurality of reference cells.

Referring to FIG. 5, the sense amplifier circuit 130 may sense data of selected memory cells during a read operation. The sense amplifier circuit 130 compares a voltage of a sensing node, which may be connected to a bit line of selected memory cells during a read operation, with the reference voltage Vref. The sense amplifier circuit 130 outputs a comparison result value SAO as read data. According to an example embodiment, the sense amplifier circuit 130 receives the reference voltage Vref in order to compensate for the resistance value variation of a memory cell. In FIG. 5, the reference voltage Vref is provided from the reference voltage generation circuit 140.

The reference voltage generation circuit 140 may generate a reference voltage Vref to read multi-level cells with reference to a bit line voltage provided from reference cells during a read operation. In a case of 2-bit multi-level cell, for example, the reference voltage generation circuit 140 generates reference voltages Vref to identify four resistance states with reference to a bit line voltage that are provided from at least two reference cells. According to another example, the reference voltage generation circuit 140 generates reference voltages Vref to identify four resistance states with reference to a bit line voltage provided from at least four reference cells.

A write driver (shown as WD) 150 may be controlled by a control logic 170, and provides a write current to bit lines of memory cells based on data provided through an I/O buffer 160. For example, the write driver 150 programs reference cells, which share the same word line with the selected memory cells, using data each time a pulse current is provided to program selected memory cells of the main area 110 during a write operation. During the write operation, the write driver 150 simultaneously programs reference cells that are connected to the selected word line WL as well as memory cells in a selected main area.

The I/O buffer 160 provides write data provided from the outside (e.g., another component and/or an external device) into the write driver 150 during a write operation. The I/O buffer 160 delivers sense amplifier output data SAO from the sense amplifier circuit 130 to the outside during a read operation.

Still referring to FIG. 5, an address decoder 180 may decode an address ADDR provided from the outside and provide the decoded address to a selection circuit (not shown) to select a word line and bit line of at least one memory cell during a write or read operation. Although not illustrated in the drawings, a plurality of memory cells may be arranged in rows (i.e., along word lines) and columns (i.e., along bit lines). Each memory cell may include a switching device and a resistance device. The switching device may be realized with various devices such as a MOS transistor and a diode, for example. The resistance device is configured to include a phase change layer. The phase change layer may be a GST material, for example.

Through the above structure, the multi-level phase change memory device 100 may includes main cells storing input/output data and reference cells corresponding to the main cells. According to an example embodiment, the reference cells are programmed into a specific resistance state each time the main cells are programmed. Accordingly, a resistance drift magnitude (which varies depending on the time elapsed from programming of reference cells) of a GST material constituting memory cells is synchronized with main cells. The reference cells and the reference voltage generation circuit 140 provide a reference voltage to compensate for a resistance variation of the main cells. Therefore, an example embodiment provides a reliable multi-level phase change memory device 100.

Figure 6:
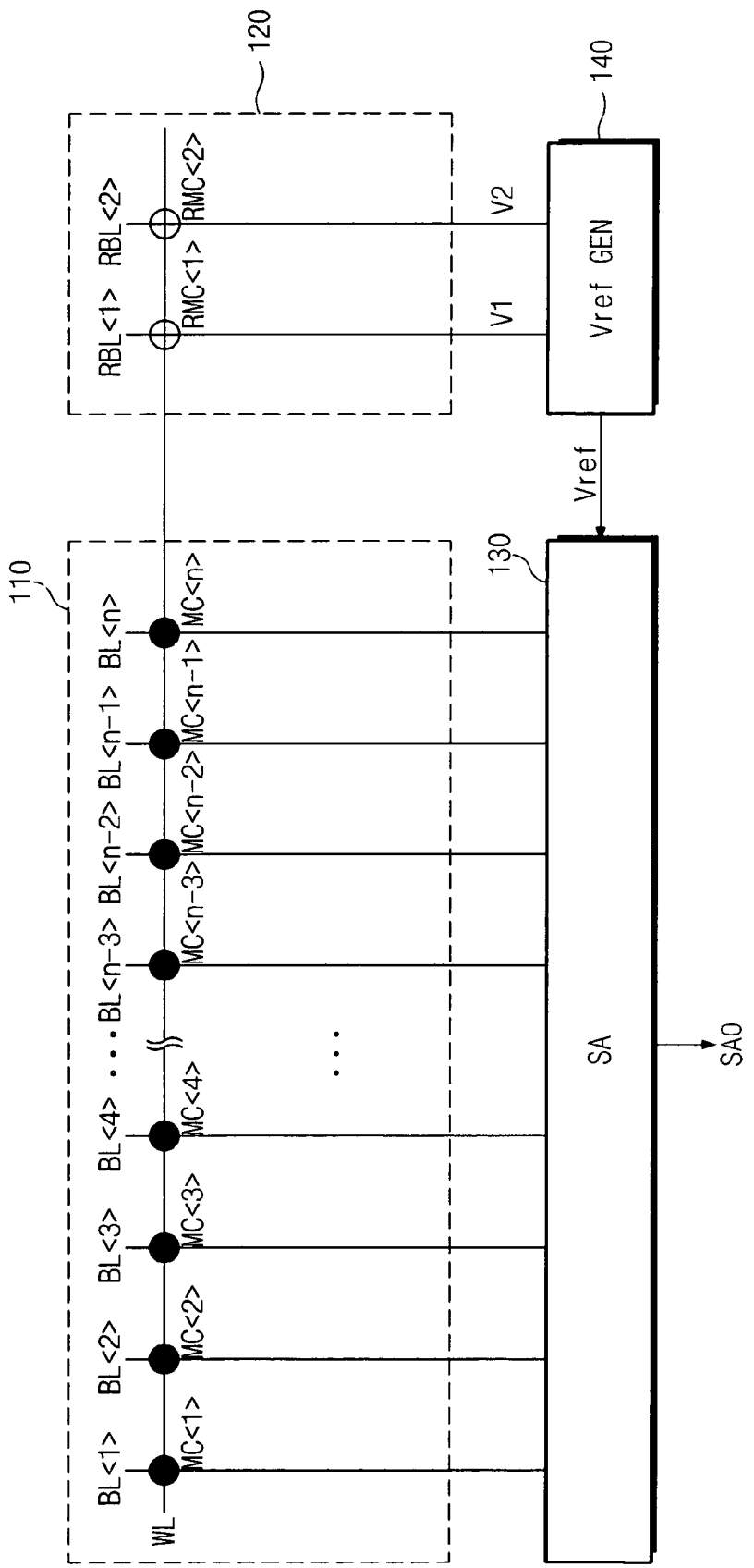
FIG. 6 is a block diagram of a structure according to an example embodiment.

FIG. 6 is a block diagram including reference cells RMC<1> and RMC<2> and a reference voltage generation circuit (shown as Vref GEN) 140 according to an example embodiment. FIG. 6 is used herein to describe an example embodiment of a multi-level phase change memory device storing 2-bit data in one memory cell. Referring to FIG. 6, the reference cells RMC<1> and RMC<2> are allocated to one word line. The reference cells RMC<1> and RMC<2> are programmed to have respectively different resistance states each time data are written into memory cells of a main area 110. During a read operation, reference voltage Vref is generated to identify each multi-state with reference to bit line voltages RBL<1> and RBL <2> provided by the reference cells RMC<1> and RMC<2>.

As illustrated in FIG. 6, main cells MC<1> to MC<n> of the main area 110 and the reference cells RMC<1> and RMC<2> of a reference area 120 are connected to the same word line WL. The main cells MC<1> to MC<n> may include 16 memory cells corresponding to an input/output unit (e.g., one word), for example. The reference cells RMC<1> and RMC<2> may be formed to share the word line WL with the 16 memory cells. The reference cells RMC<1> and RMC<2> are programmed into respectively different resistance states each time data are written into the main cells MC<1> to MC<n>. That is, the reference cells RMC<1> and RMC<2> are programmed each time at least one of the main cells sharing the same word line WL is programmed. As the reference cells RMC<1> and RMC<2> are programmed with respectively different multi-bit data, the reference cells RMC<1> and RMS<2> have respectively different cell resistances. The multi-bit data written into the reference cells RMC<1> and RMC<2> will be described in more detail with reference to FIG. 7.

During a read operation, a word line WL is selected by an address and data stored in memory cells connected to the selected word line WL are sensed by bit lines BL<1> to BL<n> and RBL<1> to RBL<2>. To be more specific, each bit line is pre-charged by a pre-charge circuit (not shown), and the sense amplifier circuit 130 senses an electric potential variation of the pre-charged bit line to determine data stored in a memory cell. For example, the sense amplifier circuit 130 compares a voltage sensed from each sense node of the BL<1> to BL<n> with a reference voltage Vref provided from the reference voltage generation circuit 140. According to a comparison result, data stored in each of the selected memory cells may be sensed and outputted. More specifically, an example embodiment of the multi-level phase change memory device 100 generates a reference voltage Vref according to electrical potentials of the bit line RBL<1> to RBL<2> of the reference cells RMC<1> and RMC<2>. The reference cells RMC<1> and RMC<2> are programmed into respectively different states among four multi-states during a program operation. Accordingly, the reference cells RMC<1> and RMC<2> have respectively different resistance values. The main cells MC<1> to MC<n> and the reference cells RMC<1> and RMC<2> are programmed at the same time. Therefore, as time elapses, resistance change rates, which occur in the main cells MC<1> to MC<n> of the variable resistors GST and the reference cells RMC<1> and RMC<2>, are substantially the same.

During a read operation, a resistance value variation of the reference cells RMC<1> and RMC<2> is sensed through the bit lines RBL<1> and RBL<2>. Voltages V1 and V2 of the bit lines RBL<1> and RBL<2> are provided into the reference voltage generation circuit 140. The reference voltage generation circuit 140 generates a reference voltage Vref to compensate for a resistance drift by referring to a resistance variation sensed from the reference cells RMC<1> and RMC<2>. The generated reference voltage Vref is provided into the sense amplifier circuit 130. The sense amplifier circuit 130 compares the reference voltage Vref with each bit line voltage of the main cells MC<1> to MC<n> to output a comparison result as sense amplifier output data SAO. According to an example embodiment described referring to FIG. 6, programmed states of the reference cells RMC<1> and RMC<2> correspond to two respectively different states among four multi-states that correspond to 2-bit data. For example, the reference cell RMC<1> may be programmed to correspond to a state of data 01 and the reference cell RMC<2> may be programmed to correspond to a state of data 10.

The main cells MC<1> to MC<n> and the reference cells RMC<1> and RMC<2> shown in FIG. 6 share one word line. However, the main cell area 110 may include additional word lines and memory cells and the reference area 120 may include reference cells associated with the word lines not specifically shown in FIG. 6 for the sake of brevity and clarity. Additionally, although the sense amplifier circuit 130 to which a plurality of bit line voltages are inputted is illustrated, a plurality of sense amplifiers corresponding to the respective bit lines may be included in the sense amplifier circuit 130. For example, if a bit structure is x8, the sense amplifier circuit 130 includes 8 sense amplifiers. If a bit structure is x16, 16 sense amplifiers are used and/or required. However, one skilled in the art will appreciate that the number of sense amplifiers is not limited to a bit structure.

Through the above-mentioned structure and/or the programming of the reference cells RMC<1> and RMC<2>, an example embodiment of a multi-level phase change memory device compensates for a resistance drift influence of memory cells, which occurs as time elapses during a read operation. Accordingly, reliability of a read operation of a multi-level phase change memory device may be improved.

Figure 7:
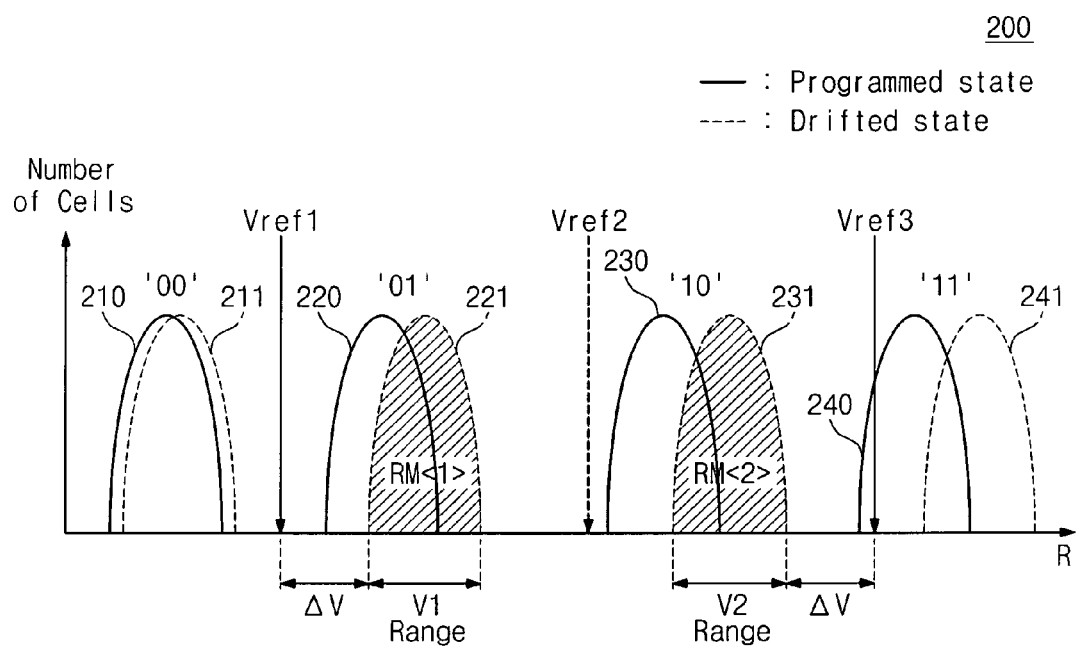
FIG. 7 is a view illustrating programmed states of reference cells of FIG. 6.

FIG. 7 is a view illustrating an example embodiment of a method of programming the reference cells RMC<1> and RMC<2> of FIG. 6 and a method of generating one or more reference voltages. Referring to FIG. 7, the reference cells RMC<1> and RMC<2> are programmed into two respectively different states among resistance states corresponding to 2-bit data (i.e., 00, 01, 10, and 11). During a read operation, the reference voltage generation circuit 140 may generate reference voltages Vref1, Vref2, and Vref3 with reference to each bit line voltage of the reference cells RMC<1> and RMC<2>. For example, the reference cell RMC<1> is programmed to have a resistance value corresponding to data 01 and the reference cell RMC<2> is programmed to have a resistance value corresponding to data 10. The program operations of the reference cells RMC<1> and RMC<2> and the main cells MC<1> to MC<n> connected to the same word line are performed simultaneously, for example. The resistance variations of the main cells MC<1> to MC<n> change from the states 210, 220, 230, and 240 at the time of programming into drifted states 211, 221, 231, and 241, respectively. The drifts of these resistance values also occur at the reference cells RMC<1> and RMC<2> programmed with data 01 and data 10. As such, at the time of programming, the resistance of the reference cell RMC<1> also has a state 220 corresponding to data 01. As time elapses, the resistance of the reference cell RMC<1> is distributed in a drifted state 221. Right after being programmed, the resistance of the reference cell RMC<2> has a state 230 corresponding to data 10. As time elapses, the resistance of the reference cell RMC<2> is distributed in a drifted state 231.

During a read operation, once a read command is inputted from the outside, the bit lines of the memory cell MC<1> to MC<n> are pre-charged. Then, the word line WL is activated (e.g., a word line voltage shifts into a low level). Data of the main cells MC<1> to MC<n> and the reference cells RMC<1> and RMC<2>, connected to a selected word line, are sensed through an electric potential change of the pre-charged bit line BL. The sense amplifier circuit 130 senses each bit line voltage of the main cells MC<1> to MC<n>. The reference voltage generation circuit 140 receives each bit line voltage of the reference cells RMC<1> and RMC<2>. The reference voltage generation circuit 140 receives voltages V1 and V2 via the bit lines RBL<1> and RBL<2>.

The reference voltage generation circuit 140 may generate a reference voltage Vref1 to identify a state 00 and a state 01 with reference to a level of the bit line voltage V1. That is, the reference voltage generation circuit 140 determines the reference voltage Vref1 with reference to the drifted resistance value 221 sensed through the bit line voltage V1. For example, the reference voltage generation circuit 140 generates the reference voltage Vref1 of a level for providing a read margin (e.g., ΔV) with reference to a level of the bit line voltage V1.

Additionally, the reference voltage generation circuit 140 may generate a reference voltage Vref3 to identify a state 10 and a state 11 with reference to a level of a bit line voltage V2. The reference cell RMC<2> is programmed into a state 10 to have a resistance value corresponding to a drifted state 231. That is, the reference voltage generation circuit 140 determines the reference voltage Vref3 with reference to the drifted resistance value 231 sensed through the bit line voltage V2. For example, the reference voltage generation circuit 140 generates the reference voltage Vref3 of a level for providing a read margin (e.g., ΔV) with reference to a level of the bit line voltage V2.

Still further, the reference voltage generation circuit 140 may generates a reference voltage Vref2 to identify a state 01 and a state 10 by using the already determined reference voltages Vref1 and Vref3. For example, the reference voltage Vref2 is determined by the arithmetic mean, i.e., (Vref1+Vref3)/2, of the reference voltage Vref1 and the reference voltage Vref3.

Even if resistance values of the memory cells MC<1> to MC<n are drifted through operations of the reference voltage generation circuit 140 as time elapses, a reliable read operation of a phase change memory device may be achieved according to an example embodiment.

Figure 8:
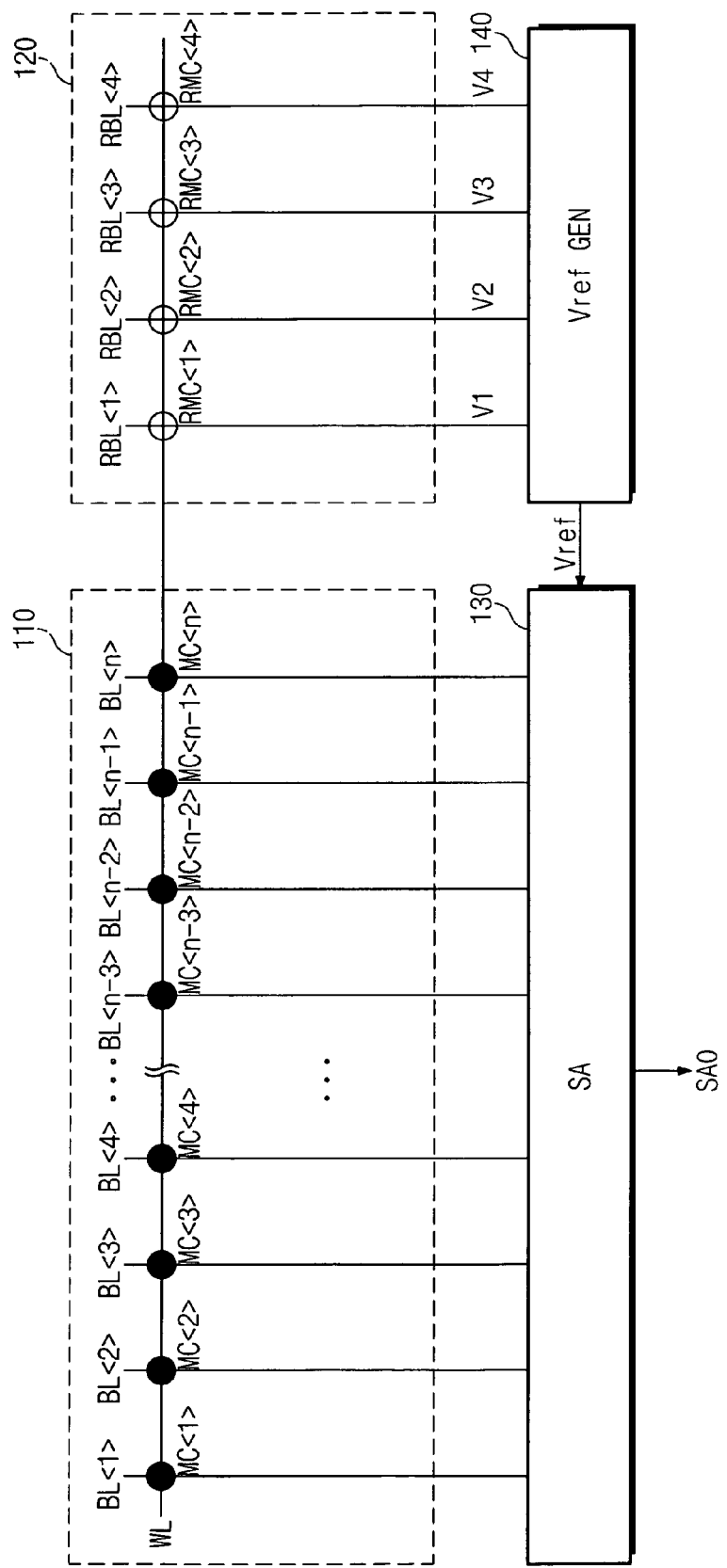
FIG. 8 is a block diagram of a structure according to another example embodiment.

FIG. 8 is an example block diagram illustrating reference cells RMC<1> to RMC<4> of a reference area 120, and a reference voltage generation circuit (shown as Vref GEN) 140 according to another example embodiment. FIG. 8 represents an example embodiment of a 2-bit multi-level phase change memory device storing 2-bit data in one memory cell. Referring to FIG. 8, at least four reference cells are allocated to one word line. The reference cells RMC<1> to RMC<4> may be respectively programmed into one of four states each time data are written into memory cells of a main area 110. The reference cells RMC<1> to RMC<4> are programmed into states corresponding to respectively different resistance values. During a read operation, the reference voltage generation circuit 140 generates a reference voltage Vref to identify each of multi-bits with reference to bit line voltages V1, V2, V3, and V4 provided from the reference cells RMC<1> to RMC<4>.

As illustrated in FIG. 8, main cells MC<1> to MC<n> of the main area 110 and the reference cells RMC<1> to RMC<4> of the reference area 120 are connected to the same word line WL. The main cells MC<1> to MC<n> may include 16 memory cells corresponding to an input/output unit (e.g., one word), for example. The reference cells RMC<1> to RMC<4> are formed to share the word line WL the 16 memory cells, for example. The reference cells RMC<1> to RMC<4> are programmed into respectively different resistance states each time data are written into the main cells MC<1> to MC<n>. The reference cells RMC<1> to RMC<4> are programmed into resistance values corresponding to respectively different data. The multi-bit data written into the reference cells RMC<1> to RMC<4> will be described in more detail with reference to FIG. 9.

During a read operation, a word line WL is selected by an address and data stored in memory cells connected to the selected word line WL are sensed by bit lines BL<1> to BL<n> and RBL<1> to RBL<4>. To be more specific, each bit line is pre-charged by a pre-charge circuit (not shown), and the sense amplifier circuit (shown as SA) 130 senses an electric potential variation of the pre-charged bit line to determined data stored in the memory cells MC<1> to MC<n>. For example, the sense amplifier circuit 130 compares a voltage sensed from each sense node of the bit lines BL<1> to BL<n> with a reference voltage Vref provided from the reference voltage generation circuit (shown as Vref GEN) 140. According to a comparison result, data stored in each selected memory cell may be sensed and outputted. More specifically, an example embodiment of the multi-level phase change memory device generates a reference voltage Vref according to electrical potentials of the bit line RBL<1> to RBL<4> of the reference cells RMC<1> to RMC<4>. The reference cells RMC<1> to RMC<4> are programmed into respectively different states among four multi-states during a program operation. Accordingly, the reference cells RMC<1> to RMC<4> have respectively different resistance values. During a read operation, the sensed voltages vary in the bit lines RBL<1> to RBL<4> according to resistance values of the reference cells RMC<1> to RMC<4>. The main cells MC<1> to MC<n> and the reference cells RMC<1> to RMC<4> are programmed at the same time. Therefore, the main cells MC<1> to MC<n> and the reference cells RMC<1> to RMC <4> have a same time variable, which may effect the cells.

The reference voltage generation circuit 140 generates a reference voltage Vref that compensates for the time elapsed with reference to a resistance variation sensed from the reference cells RMC<1> to RMC<4>, and then provides the sensed resistance variation to the sense amplifier circuit 130. The sense amplifier circuit 130 compares the reference voltage Vref with a bit line voltage in the main area 110. Programmed states of the reference cells RMC<1> to RMC<4> respectively correspond to four states of 2-bit data. For example, the reference cell RMC<1> is programmed into a state corresponding to data 00, the reference cell RMC<2> is programmed into a state corresponding to data 01, the reference cell RMC<3> is programmed into a state corresponding to data 10, and the reference cell RMC<4> is programmed into a state corresponding to data 11.

The 2-bit multi level phase change memory device described above in which the reference cells RMC<1> to RMC<4> have four states corresponding 2-bit data is not intended to limit the scope of this disclosure. For example, 8 reference cells may be used and would be required to program cells in all resistance states in a 3-bit multi level phase change memory device. Main cells MC<1> to MC<n> and the reference cells RMC<1> to RMC<4> sharing one word line are specifically shown in FIG. 8, however, one skilled in the art will appreciate that the main cell area 110 may include additional word lines and memory cells and the reference area 120 may include additional reference cells associated with the word lines not specifically shown in FIG. 8 for the sake of brevity and clarity.

Through the above-mentioned structure and/or the programming of the reference cells RMC<1> to RMC<4>, a resistance drift influence of memory cells, which may occur as time elapses during a read operation, may be compensated for by an example embodiment. Accordingly, reliability of a read operation may be improved in the multi-level phase change memory device.

Figure 9:
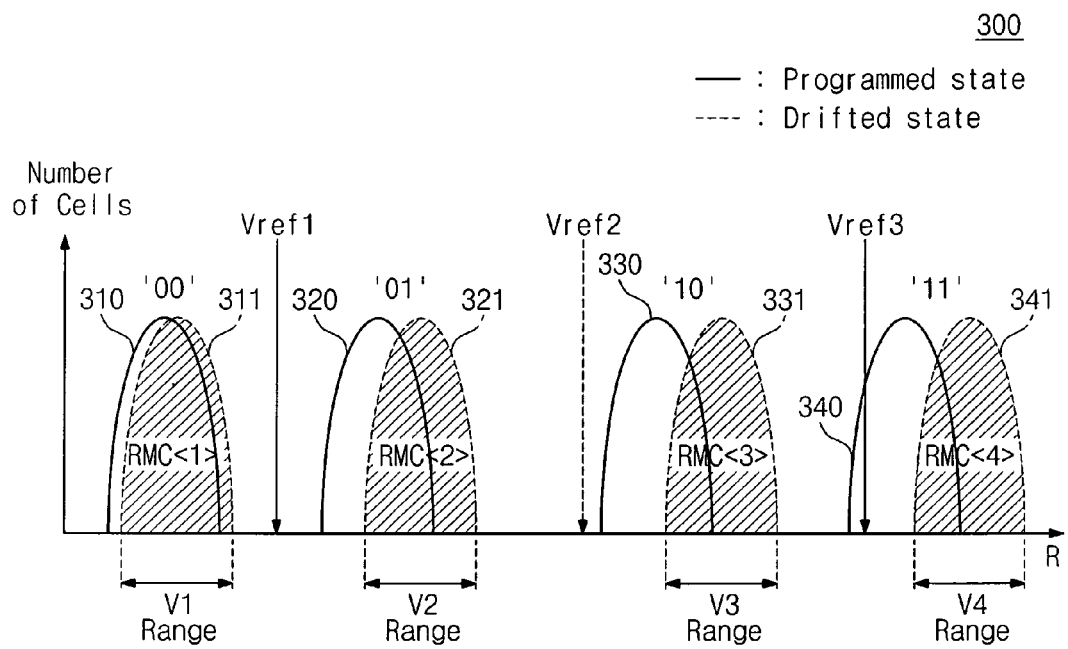
FIG. 9 is a plot illustrating programmed states of reference cells of FIG. 8.

FIG. 9 is a view illustrating an example embodiment of a method of programming the reference cells RMC<I> to RMC<4> of FIG. 8 and a method of generating one or more reference voltages. Referring to FIG. 9, the reference cells RMC<1> to RMC<4> are programmed into respectively different states among the resistance states corresponding to 2-bit data (i.e., 00, 01, 10, and 11). During a read operation, the reference voltage generation circuit 140 generates reference voltages Vref1, Vref2, and Vref3 with reference to a bit line voltage of each of the reference cells RMC<1> to RMC<4>.

The reference cells RMC<1> to RMC<4> can be programmed to respectively correspond to four resistance states. For example, the reference cell RMC<1> is programmed to have a resistance value of a state 310 corresponding to data 00, the reference cell RMC<2> is programmed to have a resistance value of a state 320 corresponding to data 01, the reference cell RMC<3> is programmed to have a resistance value of a state 330 corresponding to data 10, and the reference cell RMC<4> is programmed to have a resistance value of a state 340 corresponding to data 11. The reference cells RMC<1> to RMC<4> are programmed simultaneously when the main cells MC<1> to MC<n> are programmed, for example. That is, each time the main cells MC<1> to MC<n> connected to the same word line are programmed, the reference cells RMC<1> to RMC<4> are programmed into states, such as those mentioned in the example above. Accordingly, the magnitude of a time drift of resistance value occurring in the resistance device of memory cells are the substantially the same in the main cells MC<1> to MC<n> and the reference cells RMC<1> to RMC<4>. As time elapses, the resistance values of the main cells MC<1> and MC<n> shift into states 311, 321, 331, and 341 from the states 310, 320, 330, respectively. This resistance value variation also occurs in the reference cells RMC<1> to RMC<4> programmed with data 00, 01, 10, and 11.

Once a read command is inputted from the outside, the bit lines of the bit lines are pre-charged. Then, the word line is activated (e.g., a word line voltage shifts into a low level). Data of the main cells MC<1> to MC<n> and the reference cells RMC<1> to RMC<4> connected to a selected word line are sensed as an electric potential change of the pre-charged bit line BL. The sense amplifier circuit 130 senses a bit line voltage of the main cells MC<1> to MC<n>. The reference voltage generation circuit 140 receives each bit line voltage of the reference cells RMC<1> to RMC<4>. The reference voltage generation circuit 140 receives voltages V1, V2, V3, and V4 via the bit lines RBL<1> to RBL<4>. The reference voltage generation circuit 140 generates a reference voltage by using a level of the voltages V1, V2, V3, and V4. The reference voltage generation circuit 140 generates reference voltages Vref1, Vref2, and Vref3 corresponding to the respective states, which consider drifts of resistance, with reference to the voltages V1, V2, V3, and V4.

An example embodiment including reference cells programmed with a resistance value corresponding to each state can reduce loads of the reference voltage generation circuit 140. In an example embodiment described with respect to FIGS. 8 and 9, the reference cells RMC<1> to RMC<4> provide four resistance states storing 2-bit data into the multi-level phase change memory device. That is, four reference cells are used for each one word line. However, if a multi-level cell stores 3-bit data, eight reference cells are used for at each one word line.

An example embodiment of a reference voltage generation circuit 140 shown in FIG. 9 may provide a reference voltage used for reducing and/or minimizing a read error regardless of time drift of resistance.

Figure 10:
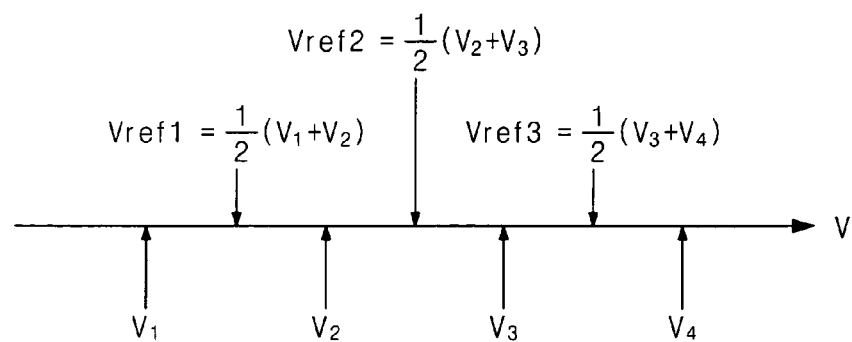
FIG. 10 is a plot illustrating a variable reference voltages.

FIG. 10 is a plot illustrating the generation and/or calculation of variable reference voltages Vref1, Vref2, and Vref3 using voltages V1, V2, V3, and V4 provided from the reference cells RMC<1> to RMC<4> of FIG. 8. As illustrated in FIG. 9, each of the variable reference voltages Vref1, Vref2, and Vref3 can be determined using an arithmetic calculation. For example, the reference voltage Vref1 for identifying data 00 and data 01 can be obtained by the arithmetic mean (i.e., (V1+V2)/2) of the voltages V2 and V3 provided from the reference cells RMC<2> and RMC<3>. The reference voltage Vref3 for identifying data 10 and data 00 can be obtained by the arithmetic mean (i.e., (V3+V4)/2) of the voltages V3 and V4 provided from the reference cells RMC<3> and RMC<4>. The above-described calculations assume the reference cell RMC<1> is programmed to have a resistance value of the state 310 of FIG. 9 corresponding to data 00, the reference cell RMC<2> is programmed to have a resistance value of the state 320 of FIG. 9 corresponding to data 01, the reference cell RMC<3> is programmed to have a resistance value of the state 330 of FIG. 9 corresponding to data 10, and the reference cell RMC<4> is programmed to have a resistance value of the state 340 of FIG. 9 corresponding to data 11. Another assumption for the above calculations is that the reference cells RMC<1> to RMC<4> are programmed simultaneously when the main cells MC<1> to MC<n> are programmed. That is, each time the main cells MC<1> to MC<n> connected to the same word line WL are programmed, the reference cells RMC<1> to RMC<4> are programmed into the above-mentioned states. Accordingly, the time drift of resistance values and the variation magnitude according to the temperature hysteresis (which may occur in resistance devices of the memory cells) are the same in the main cells MC<1> to MC<n> and the reference cells RMC<1> to RMC<4>. Changes in resistance values of the main cells MC<1> to MC<n> based on changes according to the temperature hysteresis and/or elapsed time correspond to changes occurring in the reference cells RMC<1> to RMC<4> programmed with data 00, 01, 10, and 11. Accordingly, the reference cells RMC<1> to RMC<4> can be provided to compensate for a resistance variation according to example embodiments. Further, provided by the reference cells RMC<1> to RMC<4> may be variably generated with respect to the temperature hysteresis, the time drift, or other various factors, such that the optimized reference voltage can be provided according to example embodiments.

Figure 11:
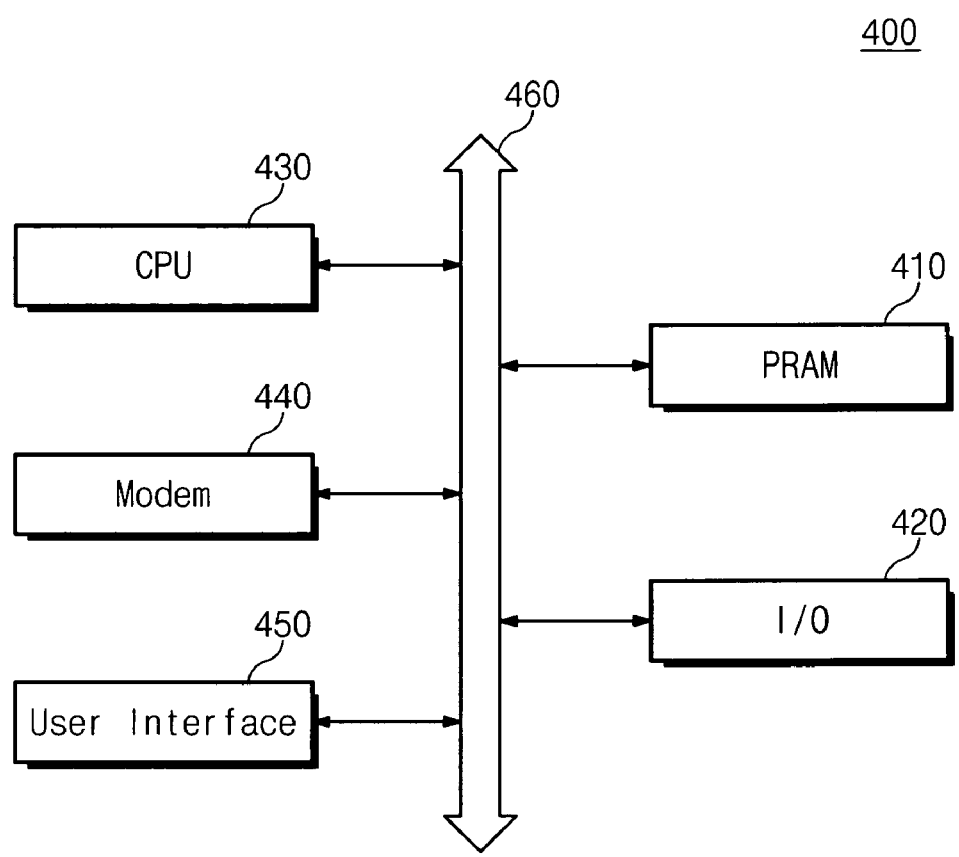
FIG. 11 is a block diagram of an information processing system according to an example embodiment.

FIG. 11 is a block diagram of an information processing system 400 including an example embodiment of a phase change memory device. The phase change memory device is a non-volatile memory device capable of retaining its stored data even if there is no power supply. The phase change memory device supports a random data access and provides fast data reading and processing. This means that an example embodiment of a phase change memory device is ideal for code storages. As mobile devices such as mobile phones, PDAs, digital cameras, portable game consoles, and MP3 players are extensively used, phase change memory devices as described above with respect to example embodiment may be used as their code storages and data storages. Furthermore, a phase change memory device according to an example embodiment may be used in home applications such as HDTV, DVD, a router, and GPS, for example.

As shown in FIG. 11, the information processing system 400 includes a PRAM 410, an input/output device (shown as I/O) 420, a central processing unit (CPU) 430, a modem 440, and a user interface 450, all of which are electrically connected through a system bus 460. The PRAM 410 may be an example embodiment of a phase change memory device. For example, the PRAM 410 may be realized with the multi-level phase change memory device of FIG. 5. The PRAM 410 stores data provided from the CPU 430. Alternatively, the PRAM 410 provides data requested from the other components of the information processing system 400. If the information processing system 400 is a mobile device, a battery (not shown) is additionally provided for an operation voltage of the information processing system 400. Although not illustrated in the drawings, it is apparent to those skilled in the art that the example embodiment of the information processing system 400 may further include an application chipset, a camera image processor (CIS), a mobile DRAM, a NAND flash memory device.

As described above, example embodiments of a phase change memory device may reduce read errors during a read operation by providing a variable reference voltage for compensating for a resistance value variation of a memory cell.

The above-disclosed subject matter is to be considered illustrative, and not restrictive, and the appended claims are intended to cover all such modifications, enhancements, and other embodiments, which fall within the true spirit and scope of this disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A variable resistance memory device comprising:
a plurality of main cells, each of the plurality of main cells programmed to any one of a plurality of resistance states, the resistance states corresponding to multi-bit data;
a plurality of reference cells programmed to at least two different resistance states among the resistance states; and
a reference voltage generation circuit configured to sense the reference cells and to generate reference voltages for identifying each of the resistance states,
wherein the variable resistance memory device is configured to program the reference cells each time at least one of the main cells is programmed.

2. The variable resistance memory device of claim 1, wherein the main cells and the reference cells are connected to a same word line.

3. The variable resistance memory device of claim 1, wherein the reference cells are programmed to have resistance values corresponding to the at least two different states among the resistance states.

4. The variable resistance memory device of claim 3, wherein
the reference cells include a first reference cell and a second reference cell, and
the variable resistance memory device is configured such that each time at least one of the main cells is programmed into any one of first to fourth states respectively corresponding to different resistance magnitudes, the first reference cell is programmed into the second state and the second reference cell is programmed into the third state, the third state higher than the second state.

5. The variable resistance memory device of claim 4, wherein
the reference voltage generation circuit is connected to the first reference cell via a first reference bit line and the second reference cell via a second reference bit line and is configured to generate:
a first reference voltage by sensing the first reference bit line to identify the first and second states;
a third reference voltage by sensing the second reference bit line to identify the third and fourth states; and
a second reference voltage to identify the second and third states by using levels of the first and third reference voltages.

6. The variable resistance memory device of claim 5, wherein the second reference voltage is an arithmetic mean of the first and third reference voltages.

7. The variable resistance memory device of claim 1, wherein a number of the reference cells correspond to a number of the resistance states and the reference cells are programmed to have resistance values respectively corresponding to the resistance states.

8. The variable resistance memory device of claim 7, wherein the variable resistance memory device is configured to program the reference cells each time the main cells are programmed to have any one of first to fourth states having respectively different resistance values, and
the reference cells include:
a first reference cell programmed into the first state;
a second reference cell programmed into the second state having a higher resistance value than the first state;
a third reference cell programmed into the third state having a higher resistance value than the second state; and
a fourth reference cell programmed into the fourth state having a higher resistance value than the third state.

9. The variable resistance memory device of claim 8, wherein
the reference voltage generation circuit is connected to the first reference cell via a first reference bit line, to the second reference cell via a second reference bit line, to the third reference cell via a third reference bit line, and to the fourth reference cell via a fourth reference bit line, and
the reference voltage generation circuit is configured to sense the first through fourth reference bit lines and to generate first to third reference voltages for identifying the first to fourth states.

10. The variable resistance memory device of claim 1, wherein each of the main cells and the reference cells includes:
a variable resistor having any one of the resistance states; and
a selection device connected to a word line and configured to switch in response to a select signal received via the word line.

11. The variable resistance memory device of claim 10, wherein the variable resistor includes chalcogenide alloys.

12. The variable resistance memory device of claim 10, wherein the variable resistor includes a material having a crystal state and a plurality of amorphous states respectively corresponding to the resistance states.

13. The variable resistance memory device of claim 1, further comprising:
a sense amplifier circuit configured to compare each bit line voltage of the main cells with at least one of the reference voltages to read multi-bit data stored in the main cells.

14. The variable resistance memory device of claim 1, further comprising:
a write driver configured to program the reference cells to have at least two respectively different states among the resistance states each time the main cells are programmed.

15. A method of operating a variable resistance memory device including memory cells and reference cells, each of the memory cells having one of a plurality of resistance states, the method comprising:
programming the reference cells each time at least one of the memory cells is programmed;
generating at least one reference voltage by using bit line voltages sensed from the reference cells; and
reading data programmed in the memory cells by referring to the at least one reference voltage.

16. The method of claim 15, wherein the programming of the reference cells includes programming the reference cells to have at least two respectively different states among the resistance states.

17. The method of claim 16, further comprising:
selecting the memory cells and reference cells for the programming of the reference cells and programming of the memory cells using a same word line.

18. The method of claim 16, wherein the programming of the reference cells includes programming the reference cells to have resistance values corresponding to the at least two respectively different states among the resistance states.

19. The method of claim 16, wherein generating the at least one reference voltage includes
sensing reference bit line voltages associated with the reference cells; and
generating a plurality of reference voltages to identify the resistance states by using the sensed reference bit line voltages.

20. A reference voltage generating method of a multi-level phase change memory device having a plurality of resistance states, the method comprising:
programming a plurality of reference cells to have resistance values corresponding to at least two respectively different states among the resistance states each time at least one main cell of the memory device is programmed;
sensing bit line voltages associated with the reference cells; and
generating at least one reference voltage for identifying resistance states of the at least one main cell using the bit line voltages sensed from the reference cells.

21. The method of claim 20, wherein sensing bit line voltages senses bit line voltages for a number of reference cells that is less than a number of the resistance states.

22. The method of claim 20, wherein sensing bit line voltages senses bit line voltages for a number of reference cells that is equal to a number of the resistance states.

23. A memory system comprising:
the variable resistance memory device of claim 1; and
a memory controller configured to control the variable resistance memory device.

24. The memory system of claim 23, wherein the reference cells are programmed to have resistance values corresponding to two respectively different states among the resistance states.

25. The memory system of claim 23, wherein
the reference cells include a first reference cell and a second reference cell, and
the variable resistance memory device is configured such that each time the at least one of the main cells is programmed into any one of first to fourth states respectively corresponding to different resistance magnitudes, the first reference cell is programmed into the second state and the second reference cell is programmed into the third state, the third state higher than the second state.

26. The memory system of claim 25, wherein
the reference voltage generation circuit is connected to the first reference cell via a first reference bit line and the second reference cell via a second reference bit line and is configured to generate:
a first reference voltage sensing the first reference bit line to identify the first and second states;
a third reference voltage sensing the second reference bit line to identify the third and fourth states; and
a second reference voltage to identify the second and third states by using levels of the first and third reference voltages.

27. The memory system of claim 26, wherein the second reference voltage is an arithmetic mean of the first and third reference voltages.

* * * * *